United States Patent
Miyashita et al.

(10) Patent No.: US 8,111,449 B2
(45) Date of Patent: Feb. 7, 2012

(54) ELECTROPHORETIC DISPLAYING APPARATUS

(75) Inventors: Takashi Miyashita, Ome (JP); Makoto Sasaki, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/820,287

(22) Filed: Jun. 22, 2010

(65) Prior Publication Data

US 2010/0328756 A1 Dec. 30, 2010

(30) Foreign Application Priority Data

Jun. 24, 2009 (JP) ................. 2009-149357
Jun. 24, 2009 (JP) ................. 2009-149359

(51) Int. Cl.
*G02B 26/00* (2006.01)
*G03G 17/04* (2006.01)
*G09G 3/34* (2006.01)

(52) U.S. Cl. ............................ 359/296; 430/31; 345/107
(58) Field of Classification Search .................. 359/296; 430/31–32; 345/107; 349/33
See application file for complete search history.

(56) References Cited

U.S. PATENT DOCUMENTS

| 7,157,842 | B2 | 1/2007 | Yao | |
|---|---|---|---|---|
| 2006/0038772 | A1* | 2/2006 | Amundson et al. | 345/107 |
| 2007/0120815 | A1* | 5/2007 | Kita et al. | 345/107 |
| 2010/0188731 | A1* | 7/2010 | Kanematsu et al. | 359/296 |

FOREIGN PATENT DOCUMENTS

| JP | 2004-272199 A | 9/2004 |
|---|---|---|
| JP | 2005-221520 A | 8/2005 |
| JP | 2005-250352 A | 9/2005 |
| JP | 2006-058544 A | 3/2006 |
| JP | 2007-025688 A | 2/2007 |
| JP | 2008-139519 A | 6/2008 |
| JP | 2008-176330 A | 7/2008 |
| JP | 2009-223094 A | 10/2009 |

OTHER PUBLICATIONS

Japanese Office Action dated Feb. 1, 2011 (and English translation thereof) in counterpart Japanese Application No. 2009-149359.
Japanese Office Action dated May 10, 2011 (and English translation thereof) in counterpart Japanese Application No. 2009-149359.

* cited by examiner

*Primary Examiner* — Dawayne Pinkney
(74) *Attorney, Agent, or Firm* — Holtz, Holtz, Goodman & Chick, PC

(57) ABSTRACT

An electrophoretic displaying apparatus, comprises: a first substrate and a second substrate placed opposite with a predetermined interval; a plurality of pixel electrodes arranged on the first substrate; signal lines arranged between the adjoining pixel electrodes; an opposed electrode provided on the second substrate; partition walls provided to stand toward the second substrate over the signal lines of the first substrate so as to enclose the plurality of pixel electrodes; and solvents severally containing a plurality of particles dispersed therein to be filled up in regions enclosed by the partition walls, wherein antireflective layer is formed on the first substrate correspondingly to the partition walls, and the signal lines is formed on a layer between the partition walls and the antireflective layer.

20 Claims, 10 Drawing Sheets

ELECTROPHORETIC DISPLAYING APPARATUS

CROSS-REFERENCE TO RELATED APPLICATIONS

This application is based upon and claims the benefits of priorities from the prior Japanese patent applications No. 2009-149357, filed Jun. 24, 2009, and No. 2009-149359, filed Jun. 24, 2009, the entire contents of which are incorporated herein by reference.

BACKGROUND OF THE INVENTION

1. Field of the Invention

The present invention relates to an electrophoretic displaying apparatus.

2. Description of the Related Art

As an electrophoretic displaying apparatus, an electrophoretic displaying apparatus adopting the electrophoretic system of a micro partition wall structure has hitherto been known. Such an electrophoretic displaying apparatus 100 is provided with, for example, as shown in FIG. 10, an opposed substrate 101 forming a display surface and a thin film transistor substrate 102 placed opposite to the opposed substrate 101. The inner surface, opposed to the substrate 101, of the thin film transistor substrate 102 is provided with a plurality of pixel electrodes 103 arranged in a matrix, and signal lines (scanning lines and data lines) 104 electrically connected to the pixel electrodes 103 through not-shown thin film transistors to enclose the circumference of each of the pixel electrodes 103. A partition wall 105, which has almost a trapezoid in view of a cross section thereof and is provided to stand toward the opposed substrate 101, is formed on each of the signal lines 104, and the upper side region of each of the pixel electrodes 103 is parted from the upper side region of an adjoining pixel electrode 103.

On the other hand, the inner surface, opposed to the thin film transistor substrate 102, of the opposed substrate 101 is provided with an opposed electrode 106 placed opposite to the plurality of pixel electrodes 103.

A solvent 107 is filled up in a space formed by these opposed substrate 101, thin film transistor substrate 102, and partition wall 105. A plurality of black particles 108 charged to be plus and a plurality of white particles 109 charged to be minus are dispersed in the solvent 107.

Then, when the voltage of the opposed electrode 106 is heightened to be higher than those of the pixel electrodes 103, the white particles 109 move to the opposed electrode 106 side, and the black particles 108 move to the pixel electrodes 103 side. Then, a white color is led to be displayed on the display surface (for example, in the state shown in FIG. 10). When the voltage of the opposed electrode 106 is adversely made to be smaller than those of the pixel electrodes 103, the white particles 109 move to the pixel electrodes 103 side, and the black particles 108 move to the opposed electrode 106 side. A black color is led to be displayed on the display surface. By performing this operation to each pixel, predetermined figures and characters are rendered on the display surface.

SUMMARY OF THE INVENTION

Here, at the time of manufacturing the electrophoretic displaying apparatus 100, the pixel electrodes 103, the signal lines 104, and the thin film transistors are formed on the inner surface of the thin film transistor substrate 102 before forming the partition walls 105. After that, the solvent 107 containing the particles 108 and 109 dispersed therein is inpoured onto the inner surface of the thin film transistor substrate 102, and the opposed substrate 101 having the opposed electrode 106 formed thereon is superposed on the thin film transistor substrate 102. Owing to such a manufacturing process, there is the problem of the remaining of the particles 108 and 109 on the upper surfaces of the partition walls 105, which is inevitable in manufacturing. If the particles 108 and 109 are remaining on the upper surfaces of the partition walls 105, the particles (black particles 108a in FIG. 10) of the color opposite to that desired to be displayed exist among pixels. Consequently, the remaining particles are one cause of lowering the contrast ratio of the electrophoretic displaying apparatus 100.

Because of this, one of the objects of the present invention is to provide an electrophoretic displaying apparatus for suppressing lowering the contrast ratio.

To achieve at least one of the aforementioned objects or other objects, an electrophoretic displaying apparatus, comprises:

a first substrate and a second substrate placed opposite with a predetermined interval;

a plurality of pixel electrodes arranged on the first substrate;

signal lines arranged between the adjoining pixel electrodes;

an opposed electrode provided on the second substrate;

partition walls provided to stand toward the second substrate over the signal lines of the first substrate so as to enclose the plurality of pixel electrodes; and solvents containing a plurality of particles dispersed therein to be filled up in regions enclosed by the partition walls, wherein antireflective layer is formed on the first substrate correspondingly to the partition walls, and the signal lines are formed on a layer between the partition walls and the antireflective layer.

In accordance with a second aspect of the present invention, an electrophoretic displaying apparatus, comprises:

a first substrate and a second substrate placed opposite with a predetermined interval;

a first electrode provided on the first substrate;

a second electrode provided on the second substrate;

a partition wall arranged between the first substrate and the second substrate to be provided to stand so as to enclose the first electrode; and a solvent containing a plurality of particles dispersed therein to be filled up in a region enclosed by the partition wall, wherein a surface, opposed to the second substrate, of the partition wall, formed on the first substrate, is formed in a convex curved surface.

According to the present invention, it is possible to provide an electrophoretic displaying apparatus for suppressing lowering the contrast ratio.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

In the following, the best mode for implementing the present invention will be described with reference to the attached drawings. Technically preferable various limitations for implementing the present invention are, however, given to the embodiments to be described in the following, but the scope of the invention is not limited to the following embodiments and shown examples.

First Embodiment

A first embodiment of the present invention will first be described with reference to the drawings.

Figure 1:
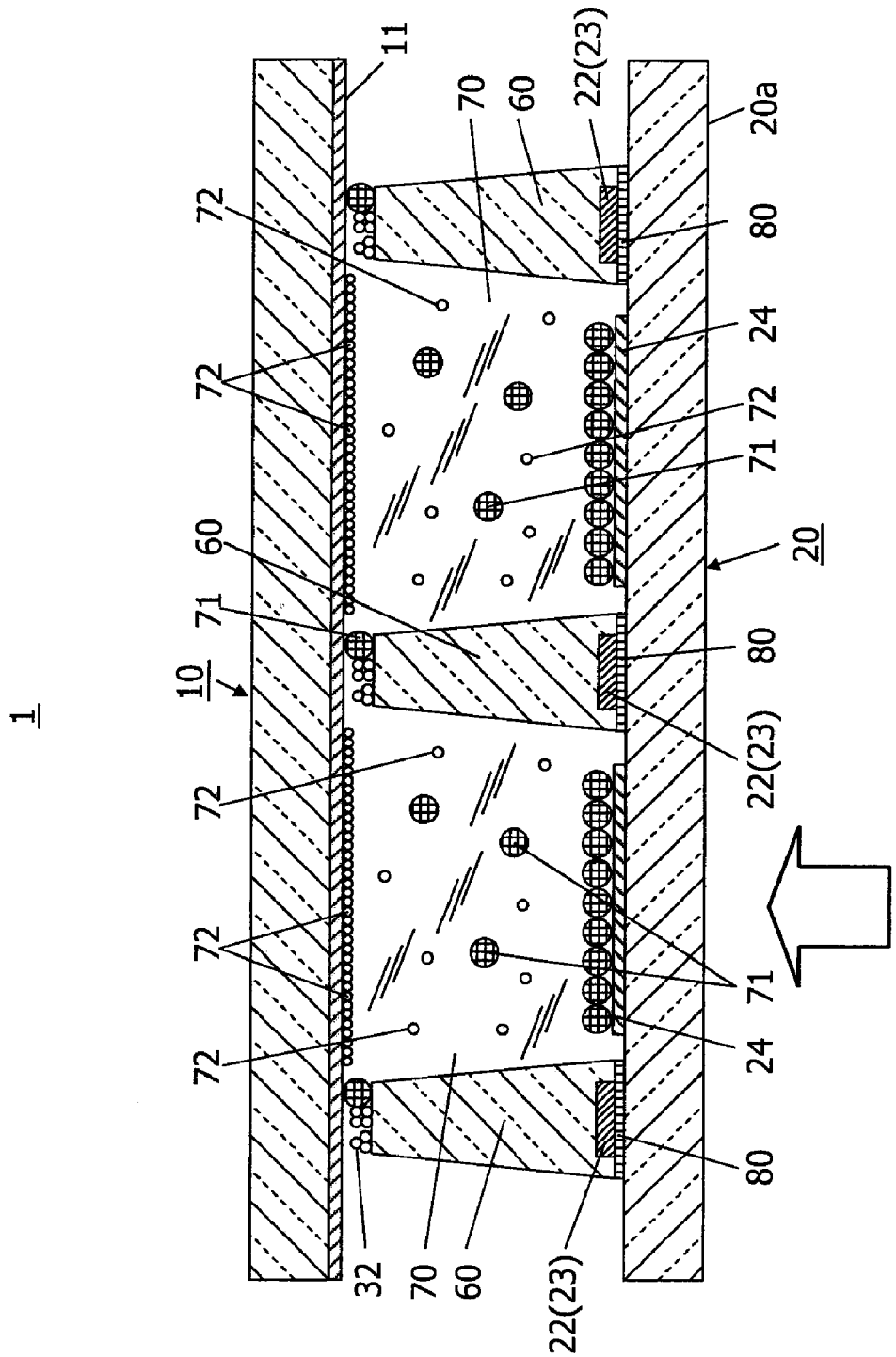
FIG. 1 is a sectional view schematically showing the configuration of the principal part of an electrophoretic displaying apparatus of the first embodiment.

FIG. 1 is a sectional view schematically showing the configuration of the principal part of an electrophoretic displaying apparatus of the first embodiment. As shown in FIG. 1, the electrophoretic displaying apparatus 1 is provided with an opposed substrate 10 and a thin film transistor substrate 20 placed opposite with a predetermined interval from the opposed substrate 10 with partition walls 60. The opposed substrate 10 is a second substrate, and the thin film transistor substrate 20 is a first substrate. Pixel electrodes 24 are formed in a matrix on the thin film transistor substrate 20, and scanning lines 22 and data lines 23 as signal lines are formed between the pixel electrodes 24. The partition walls 60 are formed on scanning lines 22 and data lines 23 in a lattice, and antireflective layer 80 is formed between both of the scanning lines 22 and the data lines 23, and the thin film transistor substrate 20. A not-shown frame-like seal material is formed between the opposed substrate 10 and the thin film transistor substrate 20, and spaces are formed between a couple of substrates with the partition walls 60 as spacers. Solvents 70 containing black color particles 71 and white color particles 72, both dispersed in the solvents 70, are enclosed in the spaces.

The opposed substrate 10 is made of, for example, glass. An opposed electrode 11 is laminated on the inner surface, opposed to the thin film transistor substrate 20, of the opposed substrate 10. The opposed electrode 11 is made of, for example, indium thin oxide (ITO; tin-doped indium oxide).

Two kinds particles, each kind including a plurality of particles, which are different from each other in the polarities of their surfaces and their colors, are dispersed in the solvents 70. One of the two kinds of particles is, for example, the black color particles 71, made of carbon charged to be plus, and the other kind of particles is, for example, white color particles 72, made of titanium oxide ($TiO_2$) charged to be minus. Here, each of the black color particles 71 has a diameter equal to or less than 5.0 µm, and each of the white color particles 72 has a diameter equal to or less than 0.3 µm. Then, as the solvents 70, a dispersive medium having a dielectric constant lower than those of the black color particles 71 and the white color particles 72 is used.

Figure 2:
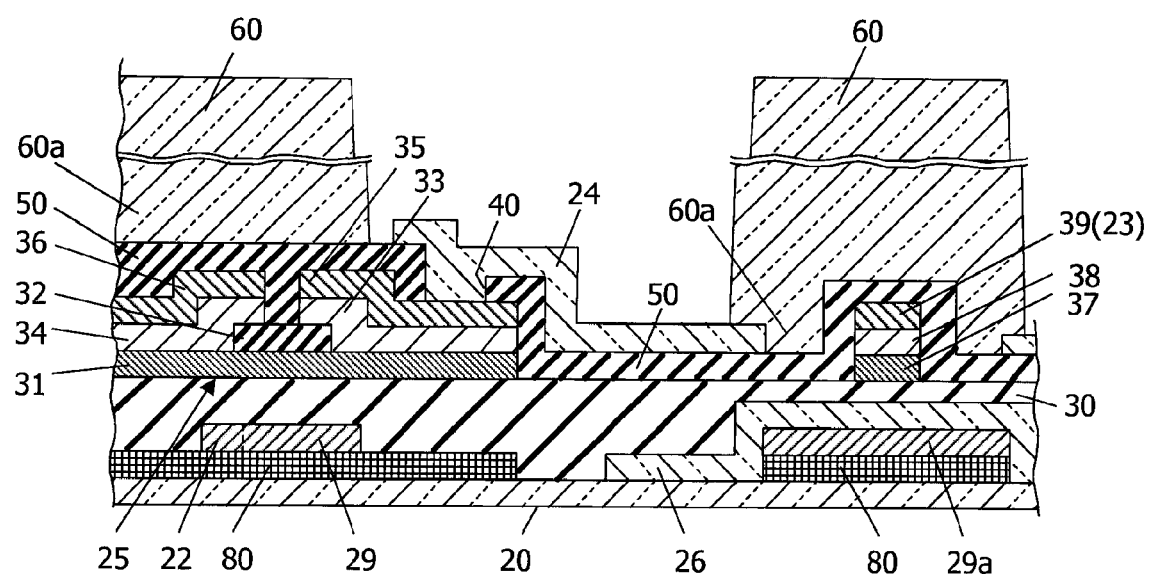
FIG. 2 is a sectional view showing the configuration of the principal part of the thin film transistor substrate of the electrophoretic displaying apparatus and the sectional view taken along the line II-II in FIG. 3.
Figure 3:
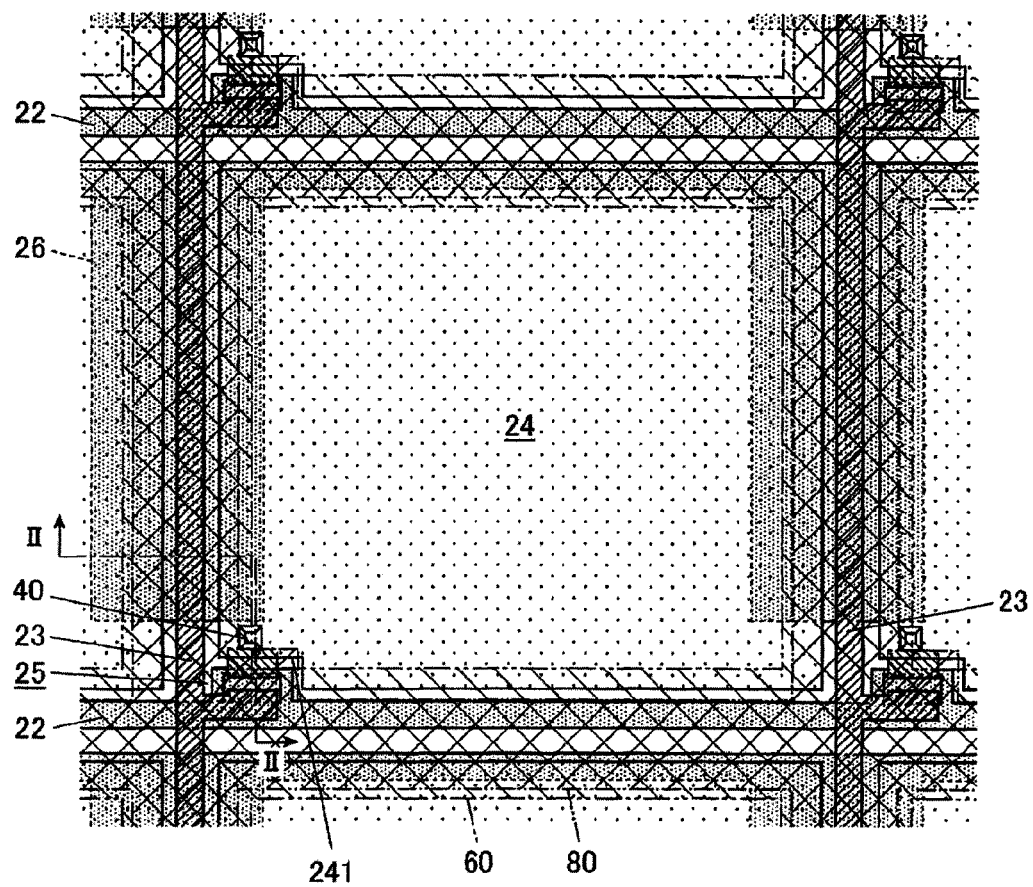
FIG. 3 is a transmissive plane view showing the configuration of the principal part of the thin film transistor substrate of the electrophoretic displaying apparatus.

Next, the thin film transistor substrate 20 will be described in detail with reference to FIGS. 2 and 3. FIG. 3 is a transmissive plane view showing the configuration of the principal part of the thin film transistor substrate 20. Incidentally, FIG. 2 is a sectional view taken along the line II-II in FIG. 3.

The planar structure of the thin film transistor substrate 20 will first be described with reference to FIG. 3. The thin film transistor substrate 20 is made of glass or the like, and the plurality of scanning lines 22 and the plurality of data lines 23 are formed to cross each other on the upper surface of the thin film transistor substrate 20. In this case, the plurality of scanning lines 22 is provided to extend into row directions, and the plurality of data lines 23 is provided to extend into column directions.

Each of the pixel electrodes 24 shaped in almost a square having a notched part is provided in each region enclosed by each of the scanning lines 22 and each of the data lines 23 on the thin film transistor substrate 20. The plurality of pixel electrodes 24 is hereby arranged in a matrix on the thin film transistor substrate 20. Thin film transistors 25 as switching elements are arranged at notched parts 241 of the pixel electrodes 24. The pixel electrodes 24 are electrically connected to the scanning lines 22 and the data lines 23 through the thin film transistors 25.

Then, the partition walls 60 provided to stand toward the opposed substrate 10 are formed on the scanning lines 22 and the data lines 23. The plurality of pixels composed of the pixel electrodes 24 is individually separated by the partition walls 60.

Moreover, a plurality of compensatory capacity lines 26 is provided on the thin film transistor substrate 20. The compensatory capacity lines 26 are formed to overlap with three sides of each of the pixel electrodes 24 except the lower side thereof in the drawing.

Next, the cross-sectional structure of the thin film transistor substrate 20 will be described.

As shown in FIG. 2, the antireflective layer 80 made of chromium oxide ($CrO_2$) are formed to be opposed to each of the scanning lines 22 and the data lines 23 on the inner surface of the thin film transistor substrate 20 opposed to the opposed substrate 10. The antireflective layer 80 is formed to be widened from the regions in which the scanning lines 22 and the data lines 23 are formed. Incidentally, the antireflective layer 80 may be made of a photoresistive resin, such as photoresistive black polyimide, besides $CrO_2$.

Moreover, gate electrodes 29 made of chromium (Cr) or the like and the scanning lines 22 connected to the gate electrodes 29 are formed at predetermined points on the inner surface side of the thin film transistor substrate 20. The gate electrodes 29 and the scanning lines 22 are formed on the antireflective layer 80. The gate electrodes 29 are arranged at the points to be formed as the thin film transistors 25. Moreover, gate lines 29a made of Cr or the like and the compensatory capacity lines 26 made of indium tin oxide (ITO) or the like to cover the gate lines 29a are formed on other predetermined points on the inner surface side of the thin film transistor substrate 20. The gate lines 29a is formed on the antireflective layer 80, and the compensatory capacity lines 26 are formed to cover both the gate lines 29a and the antireflective layer 80.

Then, gate insulation layer 30 made of, for example, silicon oxide or silicon nitride are formed on the thin film transistor substrate 20 to cover the gate electrodes 29, the scanning lines 22, and the compensatory capacity lines 26. The gate electrodes 29 are hereby led to be arranged on the lower layer sides of the gate insulation layer 30.

Semiconductor thin layer 31 made of a semiconductor, such as intrinsic amorphous silicon, are formed above the gate electrodes 29 on the upper surfaces of the gate insulation layer 30. Channel protection layer 32 made of silicon nitride or the like are provided almost at the central parts on the upper surfaces of the semiconductor thin layer 31. Ohmic contact layers 33 and 34 made of n type amorphous silicon or the like are provided on both sides of the upper surface of the channel protection layer 32 and on the upper surfaces of the semiconductor thin layer 31 on both the sides of the channel protection layer 32.

Source electrodes 35 and drain electrodes 36, both made of, for example, Cr, are provided on the upper surfaces of the ohmic contact layers 33 and 34, respectively. The source electrodes 35 and the drain electrodes 36 are hereby led to be arranged on the upper layer sides of the gate insulation layer 30. Here, the thin film transistors 25 are inversely-staggered type transistors, and are composed of the gate electrodes 29, the gate insulation layer 30, the semiconductor thin layer 31, the channel protection layer 32, the ohmic contact layers 33 and 34, the source electrodes 35, and the drain electrodes 36.

Moreover, also semiconductor thin layer 37 made of a semiconductor, such as intrinsic amorphous silicon, are formed in the formation regions of the data lines 23 on the upper surfaces of the gate insulation layer 30. Ohmic contact layers 38 made of an n type amorphous silicon or the like are provided on the upper surfaces of the semiconductor thin layer 37. Then, drain layer 39 made of chromium or the like are formed on the upper surfaces of the ohmic contact layers 38. The drain layer 39 form the data lines 23.

Then, over coat layer 50 made of silicon oxide or the like as interlayer insulation layer is formed on the upper layer sides of the thin film transistors 25 and the data lines 23 to cover the thin film transistors 25 and the data lines 23. Contact holes 40 are formed on the upper surfaces of the source electrodes 35 in the over coat layer 50. To put it concretely, the contact holes 40 are formed in the upper surfaces at parts separated from the channel protection layer 32 in the source electrodes 35.

The transparent pixel electrodes 24 made of ITO or the like are formed at predetermined points of the upper surfaces of the over coat layer 50, as shown in FIGS. 2 and 3, to electrically connect the source electrodes 35 through the contact holes 40.

Then, the partition walls 60 provided to stand toward the opposed substrate 10 from the upper parts of the scanning lines 22 and the data lines 23 over the thin film transistor substrate 20 are made of, for example, a photoresistive resin, such as photosensitive acryl. The partition walls 60 are severally formed almost in a trapezoid in view of a cross section thereof, and their base parts 60a are formed to be widened from the widths of the scanning lines 22 and the data lines 23 to cover the lines 22 and 23.

Next, a manufacturing method of the electrophoretic displaying apparatus 1 will be described with reference to FIGS. 4A-6.

Figure 4A:
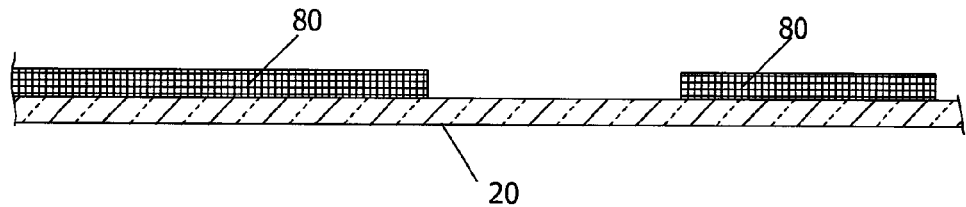
FIG. 4A is a view for explaining a method of forming each layer on the thin film transistor substrate shown in FIG. 1, and showing a state where antireflective layer is formed on the thin film transistor substrate.

As shown in FIG. 4A, the antireflective layer 80 is first formed by forming the layer of chromium oxide at predetermined points on the inner surface of the thin film transistor substrate 20.

Figure 4B:
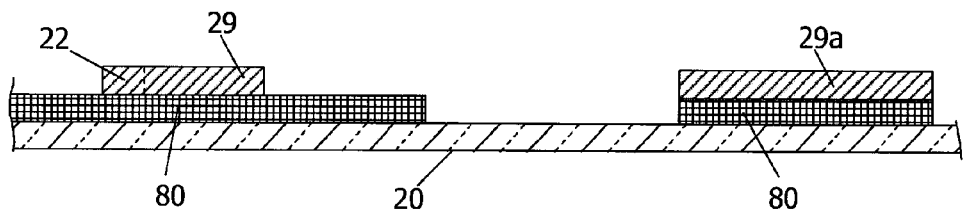
FIG. 4B is a view for explaining a method of forming each layer on the thin film transistor substrate shown in FIG. 1, and showing a state where gate electrodes, scanning lines and gate lines are formed.

Then, as shown in FIG. 4B, the gate electrodes 29, the scanning lines 22, and the gate lines 29a are formed by forming the layer of Cr at predetermined points of the antireflective layer 80.

Figure 4C:
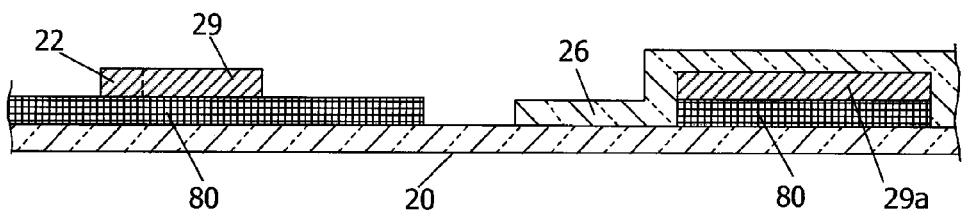
FIG. 4C is a view for explaining a method of forming each layer of the thin film transistor substrate shown in FIG. 1, and showing a state where compensatory capacity lines are formed.

After that, as shown in FIG. 4C, the compensatory capacity lines 26 are formed by forming the layer of ITO to cover the gate lines 29a.

Figure 4D:
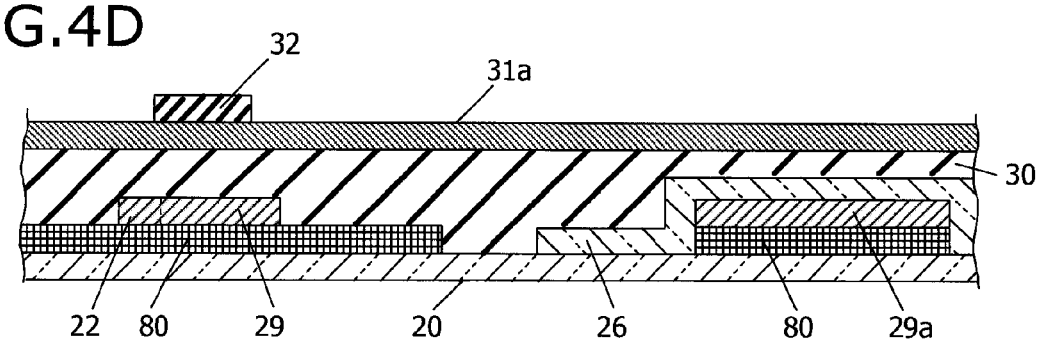
FIG. 4D is a view for explaining a method of forming each layer of the thin film transistor substrate shown in FIG. 1, and showing a state where gate insulation layer, intrinsic amorphous silicon layer, and channel protection layer are formed.

Next, as shown in FIG. 4D, the gate insulation layer 30 are formed by forming the layer of, for example, silicon oxide or silicon nitride to cover the gate electrodes 29, the scanning lines 22, and the compensatory capacity lines 26. After the formation of the gate insulation layer 30, intrinsic amorphous silicon 31a is formed as a film on the upper surfaces of the gate insulation layer 30. Furthermore, after the formation of the intrinsic amorphous silicon 31a, the channel protection layer 32 is formed by forming the layer of silicon nitride or the like at predetermined points of the upper surface of the intrinsic amorphous silicon 31a.

Figure 5A:
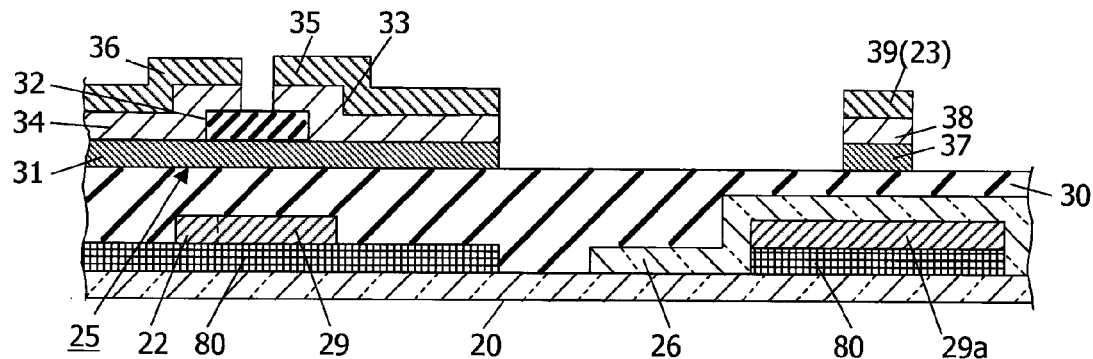
FIG. 5A is a view for explaining a method of forming each layer of the thin film transistor substrate shown in FIG. 1, and showing a state where thin film transistors and data lines are formed by forming semiconductor thin layer, ohmic contact layer, source electrodes, drain electrodes, and drain layer.

Moreover, as shown in FIG. 5A, unnecessary parts of the intrinsic amorphous silicon 31a are removed by a well-known etching method or the like to form the semiconductor thin layers 31 and 37. After the removal, the ohmic contact layers 33, 34, and 38 are formed by forming n-type amorphous silicon or the like to be layer at predetermined points, and the source electrodes 35, the drain electrodes 36, and the drain layer 39 are formed by forming Cr as layer on the ohmic contact layers 33, 34, and 38. The thin film transistors 25 and the data lines 23 are hereby formed.

Figure 5B:
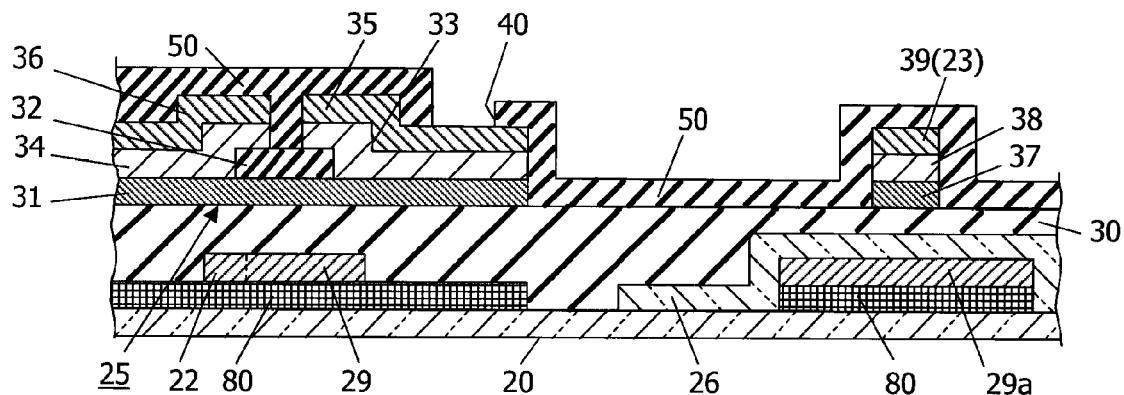
FIG. 5B is a view for explaining a method of forming each layer of the thin film transistor substrate shown in FIG. 1, and showing a state where over coat layer and contact holes are formed.

As shown in FIG. 5B, the over coat layer 50 is formed by forming silicon oxide or the like as layer on the upper layer sides of the thin film transistors 25 and the data lines 23. After that, predetermined points of the over coat layer 50 is removed by a well-known etching method to form the contact holes 40.

Figure 5C:
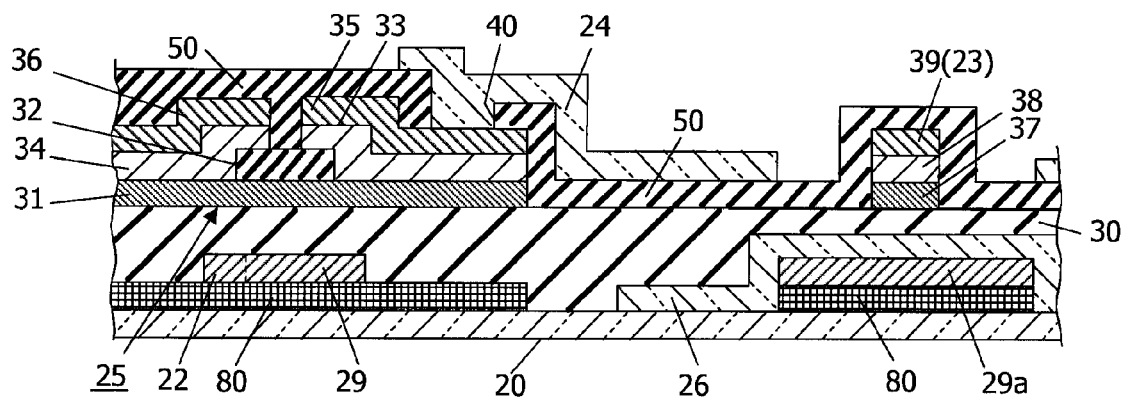
FIG. 5C is a view for explaining a method of forming each layer of the thin film transistor substrate shown in FIG. 1, and showing a state where pixel electrodes are formed.

Then, as shown in FIG. 5C, the pixel electrodes 24 are formed by forming ITO as layer at predetermined points of the upper surfaces of the over coat layer 50.

Figure 6:
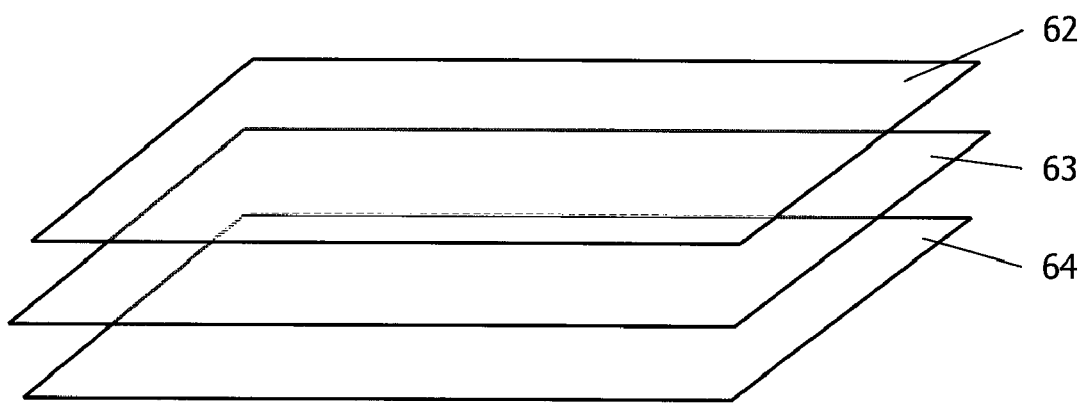
FIG. 6 is an exploded perspective view showing a simple overview of a partition wall film for forming partition walls provided in the electrophoretic displaying apparatus.

After the thin film transistor substrate 20 has been completed, the partition walls 60 are formed on the thin film transistor substrate 20. To put it concretely, the partition walls 60 are formed by using a partition wall film 61 shown in FIG. 6. FIG. 6 shows the state in which each layer is peeled off, but the partition wall film 61 is actually formed by laminating a supporting film 62, a resist film 63, and a cover film 64. For example, the supporting film 62 is made of a resin film, such as polyethylene terephthalate (PET), and the cover film 64 is made of a resin film, such as oriented polypropylene (OPP). Then, the resist film 63 is made of a photoresistive resin, such as photosensitive acryl forming the partition walls 60. The supporting film 62 is stuck on one surface of the resist film 63, and the cover film 64 is stuck on the other surface thereof.

In order to form the partition walls 60 by using the partition wall film 61, the cover film 64 is first peeled off, and the resist film 63 is pasted onto the thin film transistor substrate 20. The resist film 63 is exposed in that state, and the photosensitive acryl is transferred to predetermined positions on the thin film transistor substrate 20. After the transfer, the supporting film 62 is peeled off, and the resist film 63 is developed to remove the parts other than those transferred to the thin film transistor substrate 20. Then, post-bake is performed to the photosensitive acryl transferred onto the thin film transistor substrate 20 to heighten the adhesion property of the photosensitive acryl. Thereby, the partition walls 60 are formed as shown in FIG. 2.

After the formation of the partition walls 60, the solvents 70 containing the plurality of black color particles 71 and the plurality of white color particles 72, both dispersed in the solvents 70, are poured into a plurality of regions enclosed by the partition walls 60. After the pouring, the opposed substrate 10 is arranged over the thin film transistor substrate 20 so that the opposed electrode 11 and the pixel electrodes 24 may be opposed to each other, and the opposed substrates 10 and 20 are pasted together to be sealed with a not-shown frame-like seal material formed between the opposed substrates 10 and 20. Alternatively, the opposed substrates 10 and 20 may be pasted together to be sealed by forming a bonding layer over the whole surface of the opposed substrate 10 in advance with a resin film or the like (see FIG. 1).

Next, the operation of the electrophoretic displaying apparatus 1 of the first embodiment will be described. Incidentally, in the electrophoretic displaying apparatus 1, the display surface thereof is made to be the outer surface 20a of the thin film transistor substrate 20, and the viewing direction of the electrophoretic displaying apparatus 1 is the arrow direction in FIG. 1.

Then, when the voltage of the opposed electrode 11 is raised to be higher than those of the pixel electrodes 24, the white color particles 72, made of titanium oxide having a negative charge, move to the opposed electrode 11 side, and the black color particles 71, made of carbon black having a positive charge, move to the pixel electrodes 24 side. Then, the black color is led to be displayed on the display surface (for example, the state shown in FIG. 1). When the voltage of the opposed electrode 11 is adversely made to be smaller than those of the pixel electrodes 24, the white color particles 72 move to the pixel electrodes 24 side, and the black color particles 71 move to the opposed electrode 11 side. Then, the white color is led to be displayed on the display surface. By performing the operation described above to each of the pixels arranged in a matrix, predetermined figures and characters are rendered on the display surface.

Now, as shown in FIG. 1, parts of the black color particles 71 and the white color particles 72 are left between the partition walls 60 and the opposed substrate 10 to be the state of being nipped by the opposed substrate 10 after manufacturing. If the opposed substrate 10 side is made to be the display surface, the lowering of the contrast ratio thereof is caused owing to the existence of the particles having the color opposite to that desired to be displayed (white color particles 72 in FIG. 1) between pixels. In the electrophoretic displaying apparatus 1, however, the outer surface 20a of the thin film transistor substrate 20 is made to be the display surface. Consequently, even if the particles (white color particles 72 in FIG. 1) having a color opposite to that desired to be displayed exist between pixels, it is prevented that the particles are displayed on the display surface, and the lowering of the contrast ratio of the electrophoretic displaying apparatus 1 can be prevented.

Furthermore, if the outer surface 20a of the thin film transistor substrate 20 is made to be the display surface, mirror reflection is caused and glare becomes intensified because the scanning lines 22 and the data lines 23 are made of metal layers. The electrophoretic displaying apparatus 1 of the first embodiment accordingly makes the antireflective layer 80 intervene between the scanning lines 22 and the data lines 23, and the thin film transistor substrate 20 so as to overlap with the scanning lines 22 and the data lines 23, and the electrophoretic displaying apparatus 1 can consequently prevents the glare mentioned above to prevent the deterioration of the visual quality thereof even if the electrophoretic displaying apparatus 1 is viewed from the display surface side thereof.

As described above, according to the first embodiment, it is possible to provide the electrophoretic displaying apparatus 1 capable of preventing any drop of the contrast ratio of the display thereof with the glare thereof suppressed.

Moreover, because the antireflective layer 80 is formed to be widened from the regions in which the scanning lines 22 and the data lines 23 are formed, the display surface side of the electrophoretic displaying apparatus 1 can surely be covered by the antireflective layer 80 even if the positions of the scanning lines 22 and data lines 23 are shifted.

Second Embodiment

Next, a second embodiment of the present invention will be described with reference to the drawings. Here, in the description of the second embodiment, different aspects from the first embodiment are described, and the parts same as those of the first embodiment are denoted by the marks same as those of the first embodiment to be omitted to be described.

Figure 7:
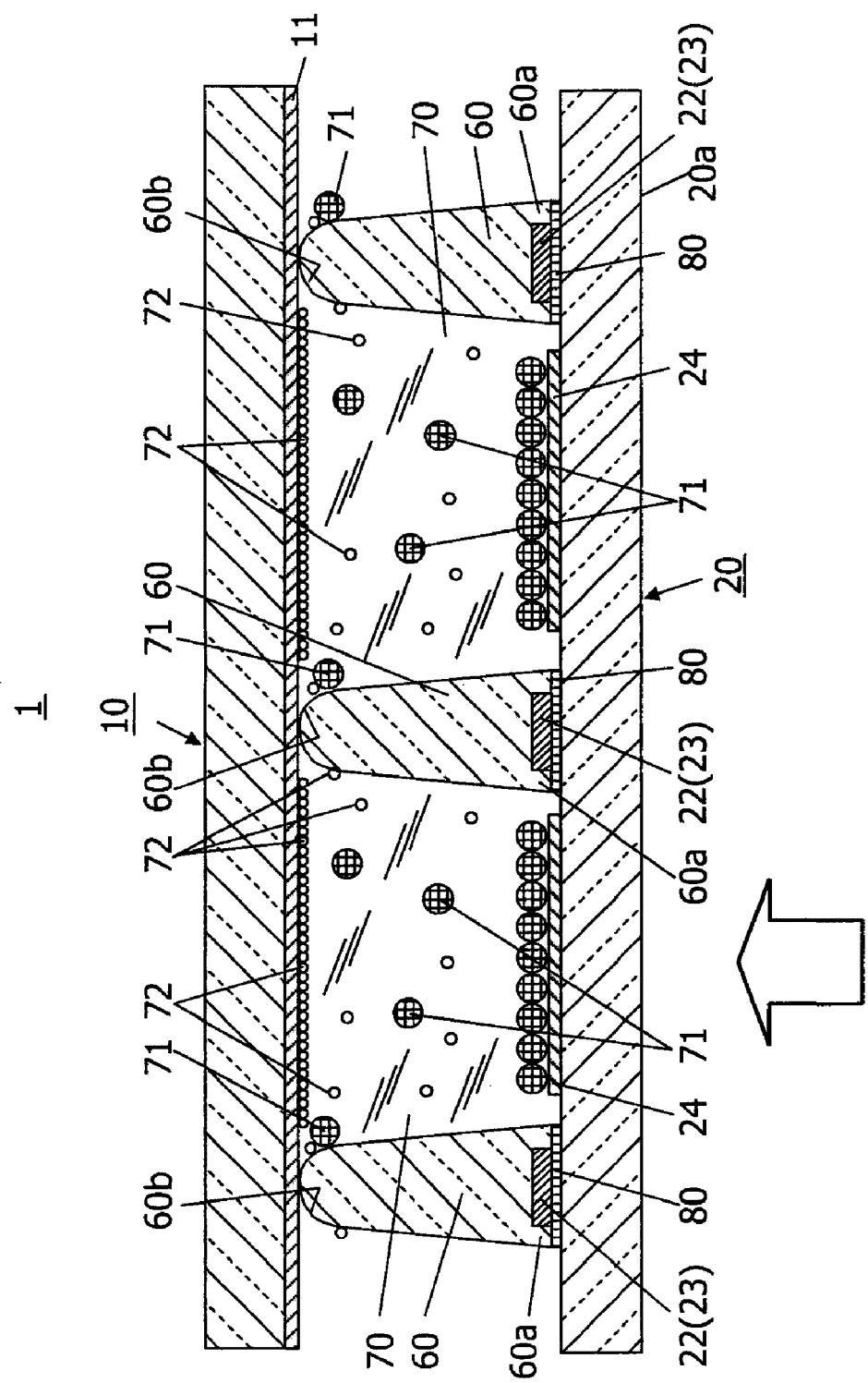
FIG. 7 is a sectional view showing the configuration of the principal part of the electrophoretic displaying apparatus of the second embodiment schematically.

FIG. 7 is a sectional view showing the configuration of the principal part of the electrophoretic displaying apparatus 1 of the second embodiment schematically. As shown in FIG. 7, the electrophoretic displaying apparatus 1 is provided with the opposed substrate 10 and the thin film transistor substrate 20 placed opposite to the opposed substrate 10 with a predetermined interval with the partition walls 60 having the upper surfaces 60b shaped in convex curved surfaces.

Figure 8:
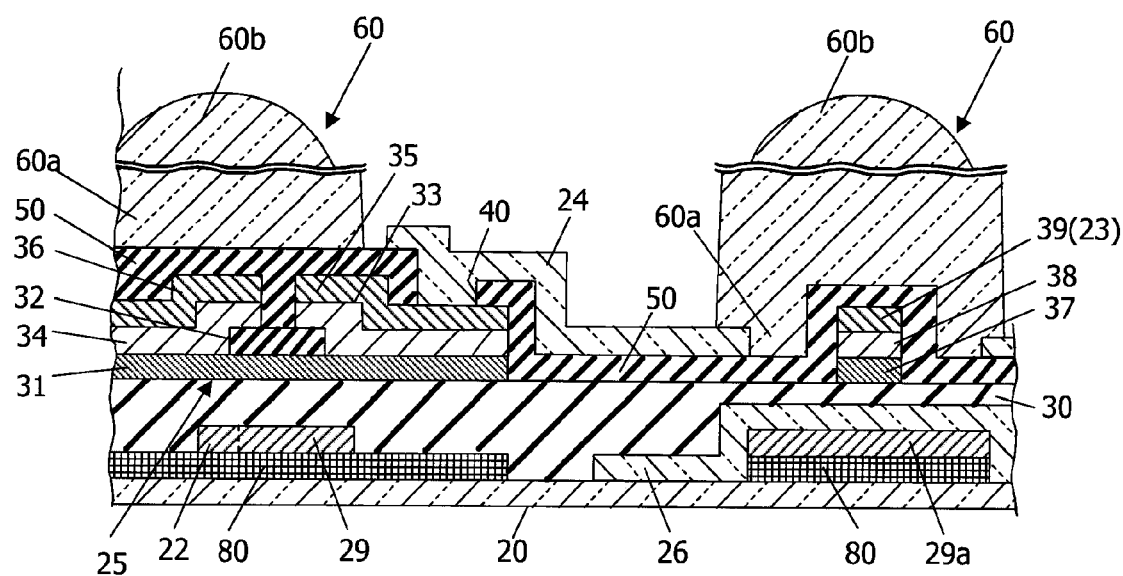
FIG. 8 is a sectional view showing the configuration of the principal part of the thin film transistor substrate and the sectional view taken along the line II-II in FIG. 3.

FIG. 8 is a sectional view taken along the line II-II in FIG. 3, which sectional view differs from FIG. 2 of the first embodiment in the partition walls 60 having the upper surfaces 60b shaped in the convex curved surfaces.

In order to form the upper surfaces 60b of the partition walls 60 to be the convex curved surfaces, over exposure or over etching is performed at the time of forming the partition walls 60 to remove the edges at the upper parts of the partition walls 60, and the upper surfaces 60b consequently become the convex curved surfaces.

After the formation of the partition walls 60, the solvents 70 containing the plurality of black color particles 71 and the plurality of white color particles 72, both dispersed therein, are poured into the plurality of regions enclosed by the partition walls 60. Here, the black color particles 71 and the white color particles 72 that are likely to be placed on the upper surfaces 60b of the partition walls 60 at the time of pouring the solvent 70 flow downward along the curved surfaces of the upper surfaces 60b. The quantities of the particles left on the upper parts of the partition walls 60 are hereby decreased.

After the pouring, the opposed substrate 10 is arranged over the thin film transistor substrate 20 so that the opposed electrode 11 and the pixel electrodes 24 may be opposed to each other, and the opposed electrode 11 and the pixel electrodes 24 are stuck to be connected to each other with a not-shown frame-like seal material. The opposed electrode 11 and the pixel electrodes 24 are thereby sealed. The black color particles 71 and the white color particles 72 placed on the partition walls 60 at the time of pouring the solvents 70 are also excluded here along the curved upper surfaces 60b in the process of abutting the partition walls 60 against the inner surface of the opposed substrate 10, and only the white color particles 72, having the particle diameters smaller than those of the black color particles 71, barely remain by being sandwiched between the apical parts of the curved surfaces of the upper surfaces 60b of the partition walls 60 and the opposed substrate 10. The partition walls 60 and the opposed substrate 10 hereby abut against each other (see FIG. 7).

As described above, the black color particles 71 and the white color particles 72 are hardly left on the upper surfaces 60b of the partition walls 60 after manufacturing, but, as shown in FIG. 7, the black color particles 71 and the white color particles 72 are left on the upper surfaces 60b of the partition walls 60 to be in the state of being sandwiched between the upper surfaces 60b and the opposed substrate 10, although the quantities of them are few. Because the outer surface 20a of the thin film transistor substrate 20 is made to be the display surface of the electrophoretic displaying apparatus 1, even if the particles (the white color particles 72 in FIG. 7) of the color opposite to that desired to be displayed exist between pixels, the particles are prevented from being observed from the display surface, and any drop of the contrast ratio of the display surface can be prevented.

Incidentally, if the outer surface 20a of the thin film transistor substrate 20 is made to be the display surface, the scanning lines 22 and the data lines 23 generally cause mirror reflection, and glare becomes intensified. Because the antireflective layer 80 is accordingly made to intervene between the scanning lines 22 and the data lines 23, and the thin film transistor substrate 20 so as to overlap with the scanning lines 22 and the data lines 23 in the electrophoretic displaying apparatus 1 of the present embodiment, the glare mentioned above can be prevented even if the electrophoretic displaying apparatus 1 is viewed from the display surface side thereof.

As described above, according to the second embodiment, the electrophoretic displaying apparatus 1 capable of preventing the drop of the contrast ratio thereof while suppressing the glare thereof can be provided.

Moreover, because the antireflective layer 80 is formed to be widened from the regions in which the scanning lines 22 and the data lines 23 are formed, even if the positions of the scanning lines 22 and the data lines 23 are shifted, the antireflective layer 80 can surely cover the display surface side.

Moreover, because the upper surfaces 60b of the partition walls 60 and the opposed substrate 10 abut against each other, the particles 71 and 72 are hard to be left on the upper surfaces 60b of the partition walls 60, and the interval between the opposed substrate 10 and the thin film transistor substrate 20 is held to be constant. Consequently, contrast non-uniformity among pixels can be suppressed.

Incidentally, the present invention is not limited to the embodiments described above, but can suitably be changed.

For example, although the second embodiment is described by illustrating the case where the upper surfaces 60b of the partition walls 60 and the opposed substrate 10 abut against each other, the upper surfaces 60b of the partition walls 60 and the opposed substrate 10 may be separated by predetermined intervals. In this case, it is preferable to set the intervals between the upper surfaces 60b of the partition walls 60 and the opposed substrate 10 to be smaller than the diameters of the smaller particles (the white color particles 72 in the second embodiment) between the two kinds of particles 71 and 72. It hereby becomes difficult for the particles 71 and 72 to be left on the upper surfaces 60b of the partition walls 60, and the drop of the contrast ratio can be more suppressed. In order to secure the intervals of the predetermined intervals, spacers (such as beads) having predetermined particle diameters larger than the heights of the partition walls 60 may be mixed into a sealing compound.

Figure 10:
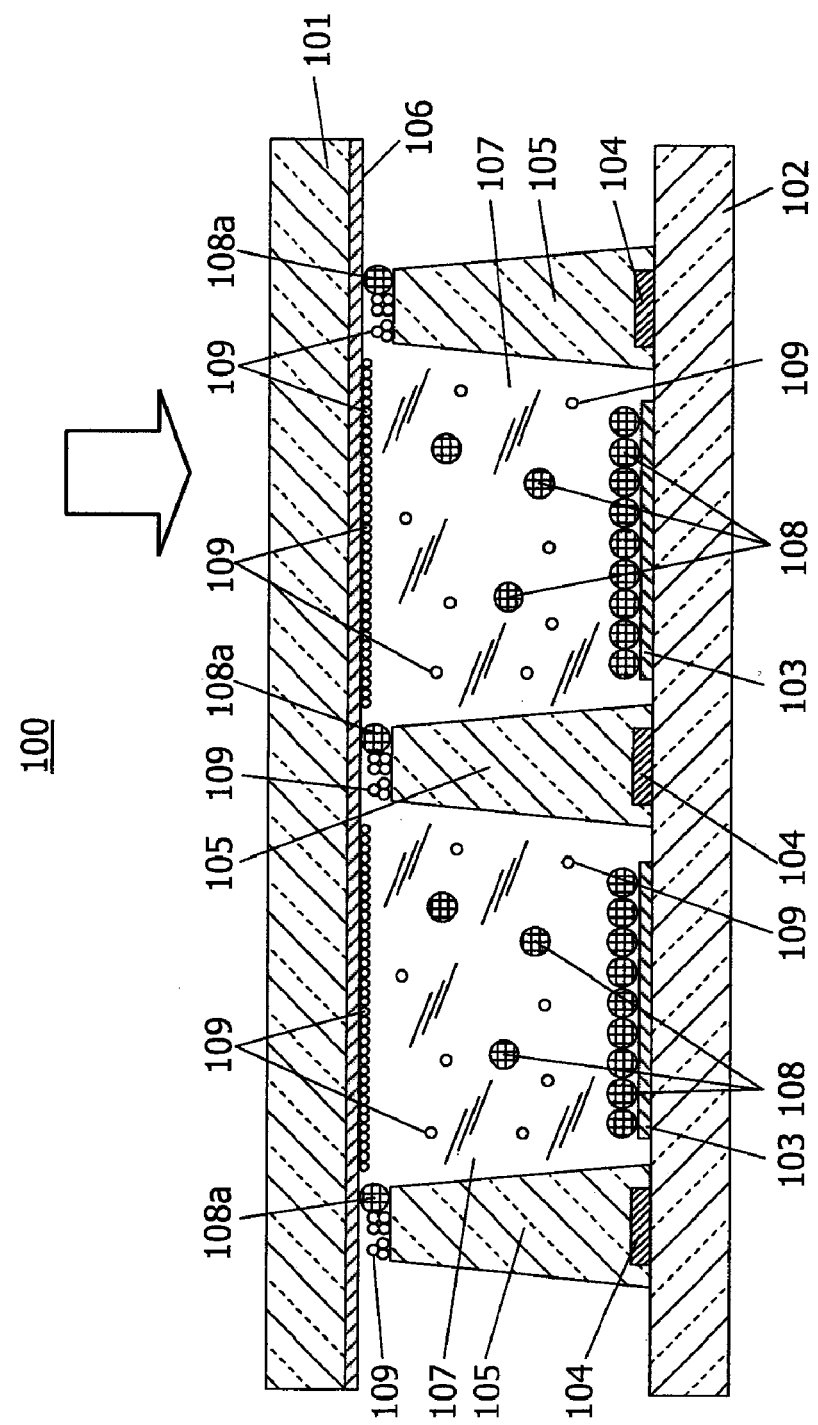
FIG. 10 is a sectional view schematically showing the configuration of the principal part of an conventional electrophoretic displaying apparatus.

Moreover, although the second embodiment has been described by illustrating the case where the opposed substrate 10 and the thin film transistor substrate 20 are made of glass substrates, at least one of these substrates 10 and 20 may be made of a flexible substrate, such as a PET substrate. For example, if it is considered that the opposed substrate 10 is a flexible substrate, a flow path is led to be opened between the partition walls 60 and the opposed substrate 10 owing to a deflection of the opposed substrate 10. This is a phenomenon generated at the time of standing the electrophoretic displaying apparatus 1 notably. At this phenomenon, as shown in FIG. 10, the black particles 108a having the particle diameters larger than the gap functioning as a flow path are left in large quantities in the upper parts of the partition walls 105 in the conventional electrophoretic displaying apparatus 100, and the conventional electrophoretic displaying apparatus 100 has the problem of the generation of black image non-uniformity and stripes. Because the electrophoretic displaying apparatus 1 of the second embodiment, however, as shown in FIG. 7, the upper surfaces 60b of the partition walls 60 are convex curved surfaces, it is difficult for the particles 71 and 72 themselves to be left in the upper parts of the partition walls 60 between pixels. Even if at least one of the couple of substrates 10 and 20 is made of a flexible substrate, the generation of black image non-uniformity and stripes can hereby be suppressed.

Then, if both of the opposed substrate 10 and the thin film transistor substrate 20 are made of flexible substrates, the generation of black image non-uniformity and black stripes can be suppressed even to the electrophoretic displaying apparatus having the whole of the display part is flexible.

Figure 9:
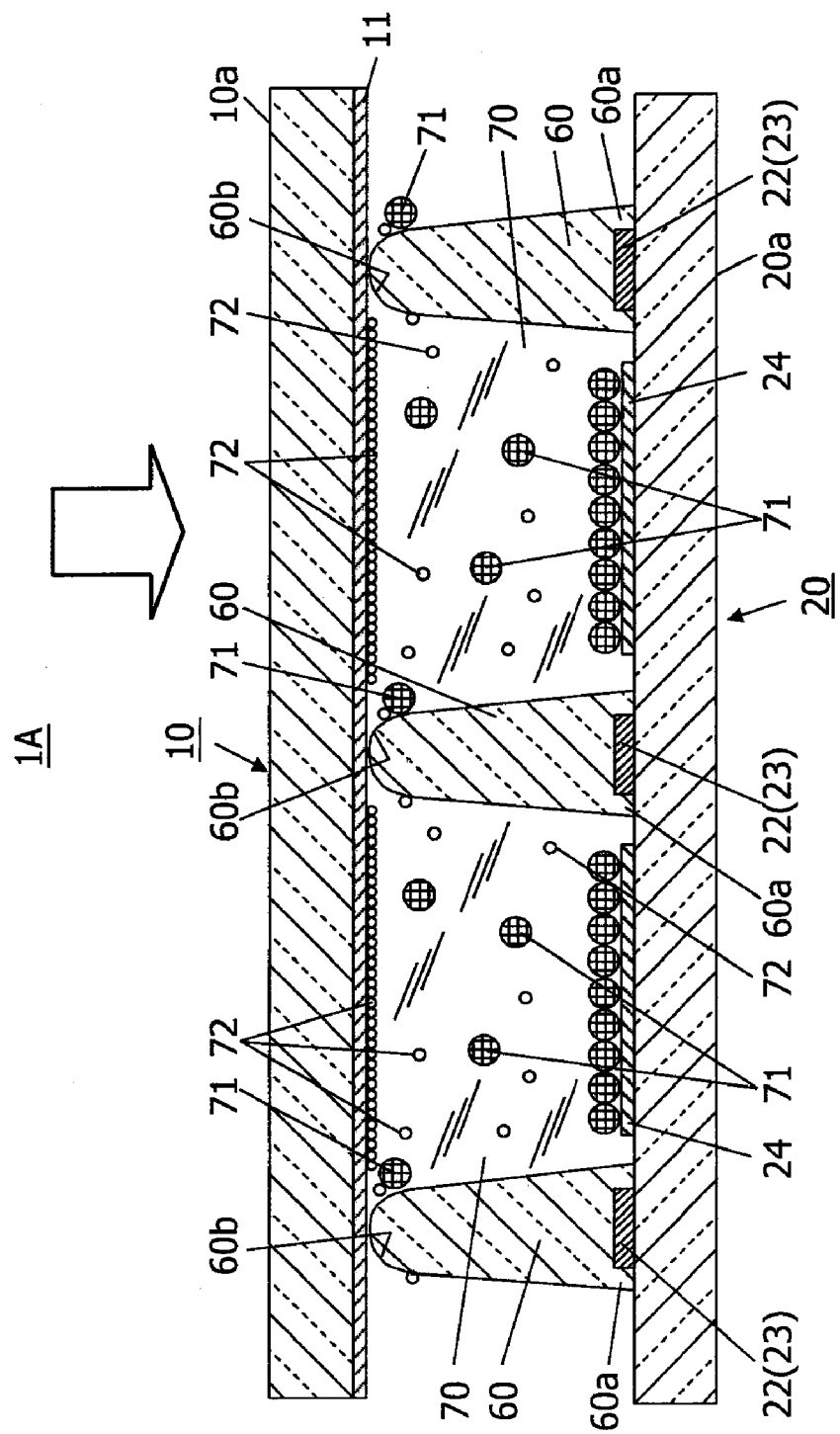
FIG. 9 is a sectional view showing the configuration of the principal part of the electrophoretic displaying apparatus of the second embodiment schematically.

Then, although the electrophoretic displaying apparatus 1 of the second embodiment is described by illustrating the case where the display surface is the outer surface 20a of the thin film transistor substrate 20, the display surface may be made to be, for example, the outer surface 10a of the opposed substrate 10 as an electrophoretic displaying apparatus 1A shown in FIG. 9. Even in this case, the particles 71 and 72 are hardly left between the partition walls 60 and the opposed substrate 10, and the particles (the black color particles 71 in FIG. 9) of the color opposite to that desired to be displayed are consequently hard to exist between pixels. Consequently, even if the outer surface 10a of the opposed substrate 10 is made to be the display surface, the drop of the contrast ratio thereof can be suppressed. Furthermore, if the outer surface 10a of the opposed substrate 10 is made to be the display surface, then the scanning lines 22 and the data lines 23 exist on the back surface side, and it consequently becomes unnecessary to consider the mirror reflection of these lines 22 and 23. That is, the antireflective layer 80 can be omitted, and it becomes possible to reduce the manufacturing cost of the electrophoretic displaying apparatus 1A.

What is claimed is:

1. An electrophoretic displaying apparatus, comprising:
    a first substrate and a second substrate placed opposite to each other with a predetermined interval therebetween;
    a plurality of pixel electrodes arranged on the first substrate;
    signal lines arranged between adjoining pixel electrodes;
    an opposed electrode provided on the second substrate;
    partition walls provided to stand toward the second substrate over the signal lines of the first substrate so as to enclose the plurality of pixel electrodes; and
    a solvent in which a plurality of particles are dispersed, and which is filled up in regions enclosed by the partition walls,
    wherein an antireflective layer is formed on the first substrate correspondingly to the partition walls, and
    wherein the signal lines are formed between the partition walls and the antireflective layer.

2. The electrophoretic displaying apparatus according to claim 1, further comprising:
    a plurality of thin film transistors provided on the first substrate so as to be individually electrically connected to each of the plurality of pixel electrodes, provided on the first substrate to be arranged in a matrix;
    scanning lines as the signal lines provided on the first substrate to extend in row directions of the plurality of thin film transistors; and
    data lines as the signal lines provided on the first substrate to extend in column directions of the plurality of thin film transistors, wherein the data lines individually enclose the plurality of pixel electrodes together with the scanning lines, and wherein the data lines are connected to the plurality of thin film transistors,
    wherein the partition walls are provided to stand from upper parts of the scanning lines and the data lines toward the second substrate so as to enclose the pixel electrodes in order to individually isolate a plurality of pixels composed of the plurality of pixel electrodes, and
    wherein the antireflective layer is formed on the first substrate correspondingly to the partition walls, and the scanning lines and the data lines are formed between the partition walls and the antireflective layer.

3. The electrophoretic displaying apparatus according to claim 2, wherein the plurality of particles include two kinds of particles having surfaces of different polarities and different colors.

4. The electrophoretic displaying apparatus according to claim 3, wherein the two kinds of particles are black color particles and white color particles.

5. The electrophoretic displaying apparatus according to claim 4, wherein diameters of the black color particles are larger than those of the white color particles.

6. The electrophoretic displaying apparatus according to claim 4, wherein the black color particles are charged to be plus, and the white color particles are charged to be minus.

7. The electrophoretic displaying apparatus according to claim 4, wherein the solvent is a dispersive media having a dielectric constant lower than that of the two kinds of particles.

8. The electrophoretic displaying apparatus according to claim 5, wherein the two kinds of particles move between the first and second substrates according to an electric field formed by applying a voltage between the pixel electrodes and the opposed electrode.

9. The electrophoretic displaying apparatus according to claim 2, wherein the antireflective layer is made of one of chromium oxide and a photoresistive resin.

10. The electrophoretic displaying apparatus according to claim 2, wherein the first substrate is a thin film transistor substrate.

11. An electrophoretic displaying apparatus, comprising:
    a first substrate and a second substrate placed opposite to each other with a predetermined interval therebetween;
    a first electrode provided on the first substrate;
    a second electrode provided on the second substrate;
    a partition wall arranged between the first substrate and the second substrate, wherein the partition wall is provided to stand so as to enclose the first electrode; and
    a solvent in which a plurality of particles are dispersed and which is filled up in a region enclosed by the partition wall,
    wherein an upper surface, opposed to the second substrate, of the partition wall formed on the first substrate, is formed to have a convex curved surface,
    wherein the partition wall has a substantially trapezoidal cross sectional shape with an upper part removed to make upper edges of the partition wall curved,
    wherein the upper surface of the partition wall is separated from a member opposed to the upper surface the partition wall, and a part of the solvent intervenes between the upper surface of the partition wall and the member opposed to the upper surface of the partition wall,
    wherein the plurality of particles dispersed in the solvent comprise a first kind of particles and a second kind of particles, and diameters of the first kind of particles are smaller than diameters of the second kind of particles, and
    wherein a thickness of the part of the solvent between the upper surface of the partition wall and the member opposed to the upper surface of the partition wall is smaller than the diameters of the first kind of particles.

12. The electrophoretic displaying apparatus according to claim 11, wherein the two kinds of particles have surfaces of different polarities and different colors.

13. The electrophoretic displaying apparatus according to claim 12, wherein the two kinds of particles are black color particles and white color particles.

14. The electrophoretic displaying apparatus according to claim 13, wherein the black color particles are charged to be plus, and the white color particles are charged to be minus.

15. The electrophoretic displaying apparatus according to claim 13, wherein the solvent is a dispersive medium having a dielectric constant lower than that of the two kinds of particles.

16. The electrophoretic displaying apparatus according to claim 13, wherein the diameters of the black color particles are larger than the diameters of the white color particles.

17. An electrophoretic displaying apparatus, comprising:
a first substrate and a second substrate placed opposite to each other with a predetermined interval therebetween;
a first electrode provided on the first substrate;
a second electrode provided on the second substrate;
a partition wall arranged between the first substrate and the second substrate, wherein the partition wall is provided to stand so as to enclose the first electrode; and
a solvent in which a plurality of particles are dispersed and which is filled up in a region enclosed by the partition wall,
wherein a surface, opposed to the second substrate, of the partition wall formed on the first substrate, is formed to have a convex curved surface,
wherein the partition wall has a substantially trapezoidal cross sectional shape with an upper part removed to make upper edges of the partition wall curved, and
wherein the electrophoretic displaying apparatus further comprises:
a plurality of pixel electrodes as the first electrode provided to be arranged in a matrix on the first substrate;
a plurality of thin film transistors provided on the first substrate so as to be individually electrically connected to each of the plurality of pixel electrodes;
scanning lines provided on the first substrate to extend in row directions of the plurality of thin film transistors;
data lines provided on the first substrate to extend in column directions of the plurality of thin film transistors, wherein the data lines individually enclose the plurality of pixel electrodes together with the scanning lines, and the data lines are connected to the plurality of thin film transistors; and
an opposed electrode as the second electrode, the opposed electrode provided on the second substrate to be opposed to the plurality of pixel electrodes,
wherein the partition wall is provided to stand from upper parts of the scanning lines and the data lines so as to individually separate a plurality of pixels composed of the plurality of pixel electrodes.

18. The electrophoretic displaying apparatus according to claim 17, further comprising:
an antireflective layer formed on the first substrate correspondingly to the partition wall;
wherein the data lines and the scanning lines as signal lines are formed between the partition wall and the antireflective layer.

19. An electrophoretic displaying apparatus, comprising:
a first substrate and a second substrate placed opposite to each other with a predetermined interval therebetween;
a first electrode provided on the first substrate;
a second electrode provided on the second substrate;
a partition wall arranged between the first substrate and the second substrate, wherein the partition wall is provided to stand so as to enclose the first electrode;
a solvent in which a plurality of particles are dispersed and which is filled up in a region enclosed by the partition wall;
a plurality of pixel electrodes as the first electrode provided to be arranged in a matrix on the first substrate;
a plurality of thin film transistors provided on the first substrate so as to be individually electrically connected to each of the plurality of pixel electrodes;
scanning lines provided on the first substrate to extend in row directions of the plurality of thin film transistors;
data lines provided on the first substrate to extend in column directions of the plurality of thin film transistors, wherein the data lines individually enclose the plurality of pixel electrodes together with the scanning lines, and the data lines are connected to the plurality of thin film transistors; and
an opposed electrode as the second electrode, the opposed electrode provided on the second substrate to be opposed to the plurality of pixel electrodes,
wherein the partition wall is provided to stand from upper parts of the scanning lines and the data lines so as to individually separate a plurality of pixels composed of the plurality of pixel electrodes, and
wherein a surface, opposed to the second substrate, of the partition wall formed on the first substrate, is formed to have a convex curved surface.

20. The electrophoretic displaying apparatus according to claim 19, further comprising:
an antireflective layer formed on the first substrate correspondingly to the partition wall;
wherein the scanning lines and the data lines as signal lines are formed between the partition wall and the antireflective layer.

* * * * *